United States Patent [19]
Meister

[11] 3,992,869
[45] Nov. 23, 1976

[54] ELECTRONIC TIMEPIECE

[75] Inventor: Rene Meister, Neuchatel, Switzerland

[73] Assignee: Ebauches S.A., Neuchatel, Switzerland

[22] Filed: Nov. 25, 1974

[21] Appl. No.: 526,843

[52] U.S. Cl. .............................. 58/23 AC; 317/242; 331/177 R

[51] Int. Cl.[2] ...................... G04C 3/00; H01G 1/02; H03B 3/04

[58] Field of Search .................. 58/23 AC; 317/242; 331/177 R; 339/256 R

[56] References Cited

UNITED STATES PATENTS

| | | | |
|---|---|---|---|
| 2,897,418 | 7/1959 | Call | 317/242 X |
| 3,049,861 | 8/1962 | Jensen | 58/23 BA |
| 3,748,845 | 7/1973 | Mutter et al. | 58/23 A |
| 3,791,133 | 2/1974 | Hashimura | 58/23 AC |
| 3,800,523 | 4/1974 | Yamazaki | 58/23 R |

*Primary Examiner*—E. S. Jackmon
*Attorney, Agent, or Firm*—Silverman & Cass, Ltd.

[57] ABSTRACT

An electronic timepiece includes an oscillating circuit for operating the timepiece. The oscillating circuit includes a capacitor having a value which determines the frequency of the oscillator and therefore the timepiece timing. The capacitor is removable and replaceable for repairing or adjusting the timepiece timing operation.

2 Claims, 7 Drawing Figures

ELECTRONIC TIMEPIECE

The present invention relates to an electronic timepiece comprising an oscillating circuit provided with at least a capacity the value of which influences the frequency of the resonator.

This timepiece is characterized by the fact that the said capacity is removably mounted on its support, so as to be able to be easily removed and replaced by another one, of different value, that permits the adjustment of the running of the timepiece by the adjustment of the frequency of the resonator.

The drawing shows, by way of example, one embodiment of the object of the invention and two modifications.

The watch represented comprises a source of current constituted by a battery 1, and a standard of frequency constituted by a quartz resonator, diagrammatically represented at 2, which pilots a step-by-step motor which has not been represented, the upper bearing of which is designated by 3. A frequency dividing circuit comprising an integrated circuit 4 decreases the frequency of the oscillations of the quartz resonator to a frequency usable for the piloting of the motor.

Figure 1:
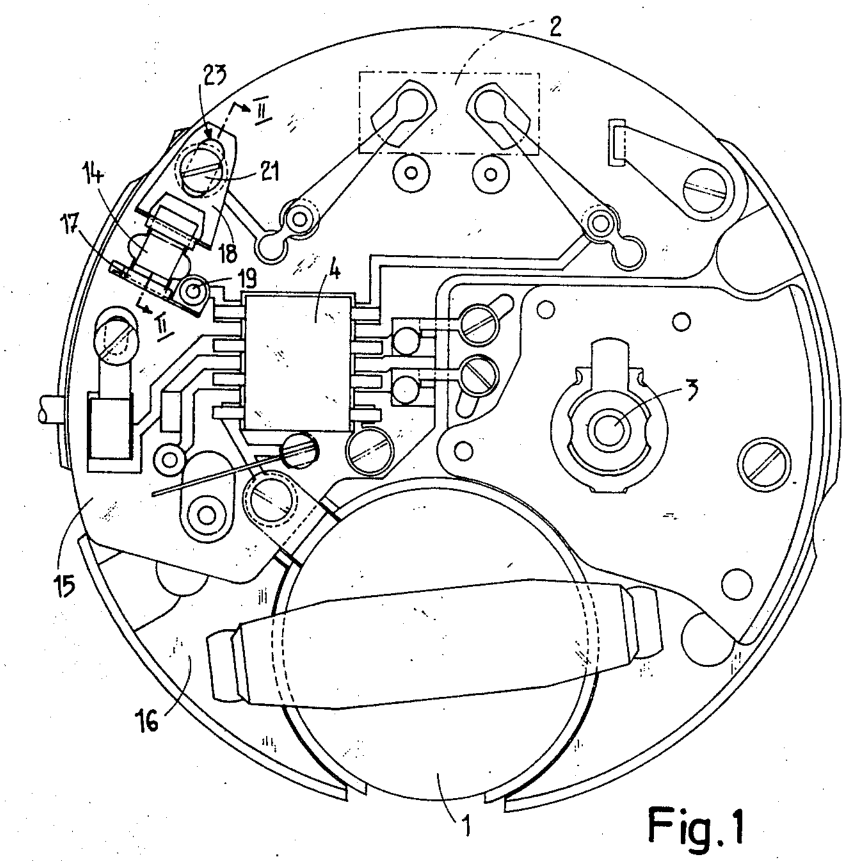
FIG. 1 is a plan view of an electronic watch.
Figure 2:
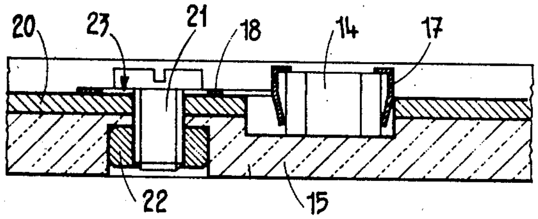
FIG. 2 is a sectional view of a detail, at a larger scale, along line II—II of FIG. 1.
Figure 3:
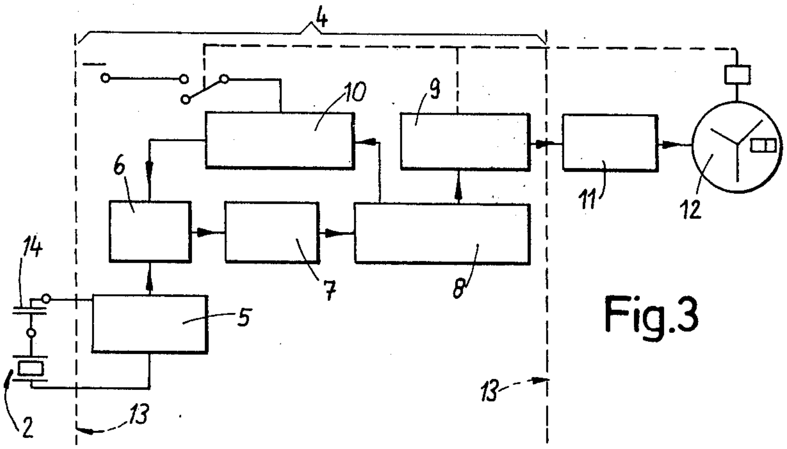
FIG. 3 is a diagram of the electronic circuit of the watch of FIG. 1.

The detail of this circuit is diagrammatically represented in FIG. 3 by blocks the purpose of each of which is the following: Maintanance: block 5. Damping: block 6. Division: block 7. Logic for shaping the signal: block 8. Control of the motor: block 9. Logic for setting the watch: block 10. The step-by-step motor has been represented by the block 11 and the display device is indicated at 12. The two dotted lines 13 of FIG. 3 indicate what is the portion of the circuit which is constituted by the integrated circuit 4. The oscillating circuit comprises, interposed between the quartz and the maintaining block 5, a capacity 14 the value of which influences the frequency of the resonator. This capacity is maintained on its support, i.e. a plate 15 made of insulating material. This plate 15 is carried by the base plate, designated by 16, of the watch movement, by means of two metallic small plates 17 and 18 one of which, the first one, is removably secured, by a rivet 19, to the plate 15, and the other of which is applied against a printed circuit 20 by a screw 21 screwed in a nut 22 (FIG. 2) situated under the plate 15. The small plate 18 is provided with an elongated aperture 23 traversed by the screw 21, that permits, when this screw is released, to withdraw the small plate so as to remove it from the capacity 14, releasing this capacity. The capacity 14 can, this way, be easily removed and replaced by another one, of different value, that permits to adjust the running of the watch by adjustment of the frequency of the resonator.

It is to be noted that the small plates 17 and 18 serve also as electric connecting members of the capacity 14 connecting it with the integrated circuit 4 and with the quartz resonator 2, respectively.

Figure 4:
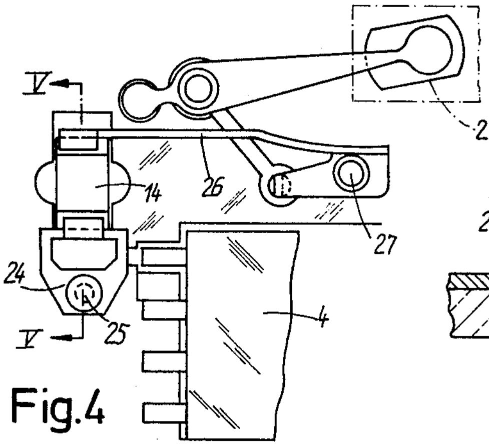
FIG. 4 is a plan view of a detail of a modification.
Figure 5:
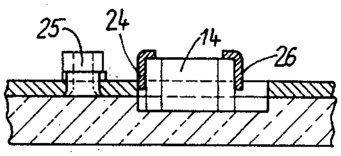
FIG. 5 is a sectional view along line V—V of FIG. 4.

In the modification of FIG. 4, the capacity 14 is maintained in place by a stationary small plate 24 maintained by a rivet 25, and which is electrically connected to the integrated circuit 4, and by a stationary elastic blade 26 maintained by a rivet 27, and which is electrically connected to the quartz resonator 2. It is sufficient, for removing the capacity 14, to slightly deform the elastic blade 26, for instance by means of tweezers, that releases the capacity.

Figure 6:
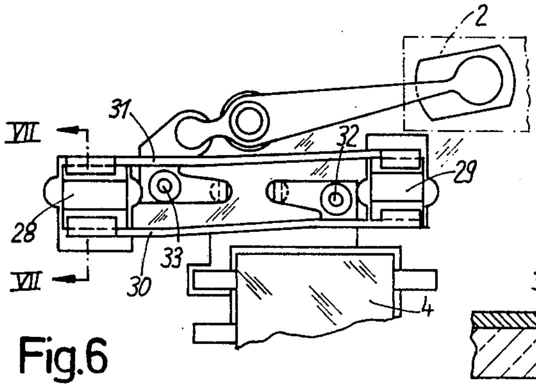
FIG. 6 is a plan view of a detail of another modification.
Figure 7:
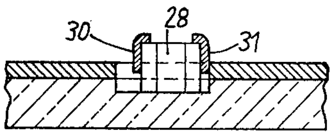
FIG. 7 is a sectional view along line VII—VII of FIG. 6.

In the modification of FIGS. 6 and 7, one uses two capacities, designated by 28 and 29, mounted in parallel, and which are maintained in place by two elastic blades 30 and 31 secured to their support by a rivet 32, respectively 33. These elastic blades ensure moreover the connection respectively with the integrated circuit 4 and with the quartz resonator 2. The two capacities 28 and 29 can be easily released by deformation of one or the other of the elastic blades 30 and 31.

What I claim is:

1. In an electronic timepiece the improvement comprising an oscillating circuit having a resonator for developing a frequency and a capacitor for adjusting said frequency, said capacitor being removably mounted on a support, so as to be able to be easily removed and replaced by another one, of different value, that permits the adjustment of the running of the timepiece by the adjustment of the frequency of the resonator, said capacitor being maintained in place by small plates which ensure its electric connection with the resonator and with circuit means in said oscillating circuit, one of said small plates being provided with an elongate aperture traversed by a securing screw, said screw being released to remove said plate and release said capacitor.

2. In an electronic timepiece the improvement comprising an oscillating circuit having a resonator for developing a frequency and a capacitor for adjusting said frequency, said capacitor being removably mounted on a support, so as to be able to be easily removed and replaced by another one, of different value, that permits the adjustment of the running of the timepiece by the adjustment of the frequency of the resonator, said capacitor being maintained in place by small plates which ensure its electric connection with the resonator and with circuit means in said oscillating circuit, at least one of said small plates being formed by the free extremity of an elastic blade, said blade being resiliently deformable for releasing said capacity.

* * * * *

UNITED STATES PATENT AND TRADEMARK OFFICE

CERTIFICATE OF CORRECTION

PATENT NO. : 3,992,869

DATED : November 23, 1976

INVENTOR(S) : RENE MEISTER

It is certified that error appears in the above-identified patent and that said Letters Patent are hereby corrected as shown below:

On the cover page, before the classification data, read the following:

[30] FOREIGN APPLICATION PRIORITY DATA

November 30, 1973 Switzerland 16,827/73

Signed and Sealed this

Tenth Day of May 1977

[SEAL]

*Attest:*

RUTH C. MASON
*Attesting Officer*

C. MARSHALL DANN
*Commissioner of Patents and Trademarks*